United States Patent [19]

Murakami et al.

[11] Patent Number: 4,551,779
[45] Date of Patent: Nov. 5, 1985

[54] SEMICONDUCTOR SWITCHING CIRCUIT WITH AN OVERCURRENT PROTECTION

[75] Inventors: Koichi Murakami, Yokosuka; Takeshi Oguro, Tokyo, both of Japan

[73] Assignee: Nissan Motor company, Limited, Yokohama, Japan

[21] Appl. No.: 540,666

[22] Filed: Oct. 11, 1983

[30] Foreign Application Priority Data

Oct. 12, 1982 [JP] Japan .................... 57-178785
Nov. 30, 1982 [JP] Japan .................... 57-209987

[51] Int. Cl.⁴ .................................... H02H 3/26
[52] U.S. Cl. .................................... 361/86; 361/91
[58] Field of Search .......... 361/88, 89, 86, 93, 361/91, 94, 98, 100, 101; 307/571; 330/207 P, 298

[56] References Cited

U.S. PATENT DOCUMENTS 4,178,620 12/1979 Yu .................................... 361/98
4,423,457 12/1983 Brajder .................................... 361/86

FOREIGN PATENT DOCUMENTS 2482800 11/1981 France .

OTHER PUBLICATIONS

"Ansteuerung von Leistungs-Feldeffekt-Transistoren Uber Optokoppler", *Elektronik*, vol. 31, No. 1, Jan. 1982, Muenchen, Deutschland.

*Primary Examiner*—Harry E. Moose, Jr.
*Attorney, Agent, or Firm*—Schwartz, Jeffery, Schwaab, Mack, Blumenthal & Evans

[57] ABSTRACT

A semiconductor switching circuit using power MOS transistor as a switching element a drain thereof being connected to a DC power supply through a load and a source thereof being grounded. The power MOS transistor is protected from destruction due to an excessive power dissipation when the load is short-circuited. The switching circuit basically comprises: (a) a first resistor intervened between an input terminal at which the switching signal for turning on the power MOS transistor is inputted and gate of the power MOS transistor; (b) an integrator which operatively integrates the drain potential of the power MOS transistor; (c) a first MOS transistor, a drain thereof being connected to the gate of the power MOS transistor, source thereof being grounded, and gate thereof being connected to an output terminal of the integrator, which turns on to ground the gate of the power MOS transistor so as to turn off the power MOS transistor when the output potential of the integrator exceeds a threshold thereof; (d) a second MOS transistor, a drain thereof being connected to the output terminal of the integrator and a source thereof being grounded; and (e) an inverter connected between the switching signal input terminal and the gate of the second MOS transistor which inverts the potential of the switching signal so that said integrator starts integration when the switching signal is inputted and is reset when no switching signal is inputted, whereby the power MOS transistor is forcefully turned off when the load is short-circuited.

11 Claims, 11 Drawing Figures

FIG.4
(a)
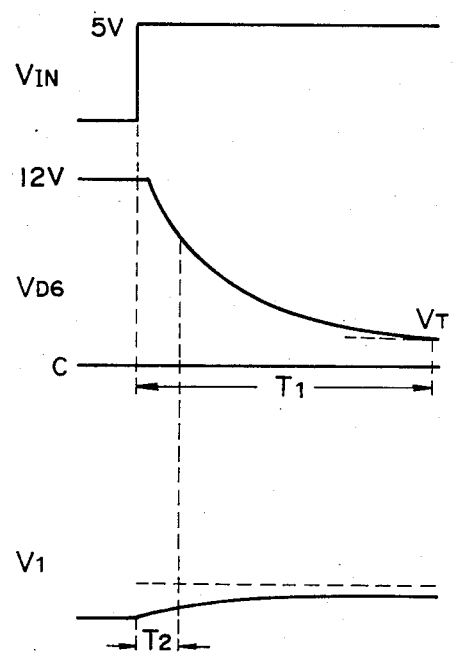
(b)
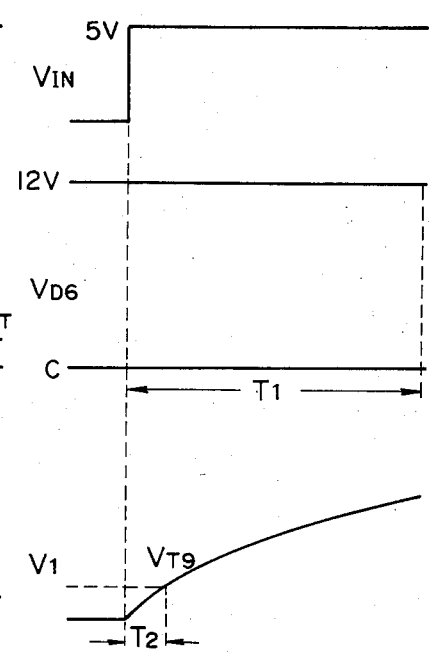

SEMICONDUCTOR SWITCHING CIRCUIT WITH AN OVERCURRENT PROTECTION

BACKGROUND OF THE INVENTION

1. Field of the Invention

The present invention relates generally to a semiconductor switching circuit using a power MOS transistor as a switching element which switches on and off a current flow through a load, particularly to a MOS (Metal Oxide Semiconductor) device switching circuit having a power MOS transistor protection circuit which interrupts an excessively high drain current flowing through the power MOS transistor by forcefully turning off the power MOS transistor when a switching signal for turning on the power MOS transistor is inputted to the gate of the power MOS transistor with the load short-circuited.

2. Description of the Prior Art

Recently, there is an industrial demand for simplifying and integrating a semiconductor switching circuit which provides on and off control of a current flowing through a load according to a switching signal and for decreasing a power supply voltage applied to the load. Therefore, a power MOS transistor device, particularly a vertical power MOS transistor device having a low on resistance and exhibiting a superior high power switching action has been applied to a switching element of the semiconductor switching circuit.

However, there is a problem that the power MOS transistor will eventually be thermally destroyed due to an excessively large power dissipation between a drain and source of the power MOS transistor, the power dissipation being determined by the product of a drain potential and drain current, when a gate potential of the power MOS transistor is turned to a high level to turn on the power MOS transistor with the load short-circuited, i.e., the power supply voltage is directly applied between the drain and source of the power MOS transistor.

To cope with such a problem, a protection circuit has been proposed, wherein a resistor is intervened between the source of the power MOS transistor and ground so that the change in the drain current thereof is converted to a corresponding voltage. The detected voltage is compared with a predetermined reference voltage by means of a comparator. The compared output signal is sent to a drive circuit intervened between an input terminal through which a switching signal is inputted and the gate of the power MOS transistor so that the drive circuit is actuated to forcefully turn the gate potential of the power MOS transistor to a low level, thus the power MOS transistor turning off. Consequently, the power MOS transistor can be protected from the above-described destruction.

However, there arise many problems in such a conventional switching circuit having the above-described protection circuit.

That is to say, since the resistor described above always consumes wasteful power whenever the power MOS transistor turns on, operation of the switching circuit results in large power consumption. Also since such a low-resistance resistor requires a large area in a semiconductor chip, when the switching circuit is integrated on a semiconductive substrate, it is difficult to integrate the whole switching circuit with high circuit density.

Furthermore, since the substrate itself acts as the drain in a case of a vertical MOS transistor when the vertical MOS transistor having a small on resistance is used as the power MOS transistor and the whole switching circuit is integrated on the same semiconductive substrate, the potential of the substrate is not stable so that it becomes difficult to form other circuit components (e.g., the comparator and drive circuit described above) on the substrate for the power MOS transistor. Consequently, discrete elements of these circuit components are needed to attach externally to the substrate for the power MOS transistor.

In addition, such a conventional switching circuit cannot accurately detect the short-circuiting of the load, when the power supply voltage is varied over a wide range and a large capacity load such as head lamps in an automotive vehicle is used as the load.

SUMMARY OF THE INVENTION

With the above-described problems in mind, it is a main object of the present invention to provide a semiconductor switching circuit which is able to protect a switching element from destruction, wherein a current of a switching signal for turning on the switching element so as to allow the current flow through a load is considerably small and power dissipation of the whole switching circuit is low.

It is another object of the present invention to provide a semiconductor switching circuit, wherein a vertical power MOS transistor is used as a switching element and the protection circuit for protection of the vertical power MOS transistor comprises a plurality of MOS devices so that the whole switching circuit can be integrated on the same substrate as the vertical power MOS transistor.

It is still another object of the present invention to provide a semiconductor switching circuit using the power MOS transistor and having a protection circuit attached to a gate of the power MOS transistor, wherein a short-circuiting of a load is detected according to difference in change of the output potential of a power MOS transistor during a fixed time interval immediately after the switching signal is sent to the switching circuit and the protection circuit is positively operated only when the load is short-circuited irrespective of the variation of the power supply voltage and kinds of load used.

This can be achieved by providing a semiconductor switching circuit basically comprising: (a) a first MOS transistor, a drain thereof connected to a DC power supply through a load and source thereof being grounded, which turns on when a switching signal exceeding a threshold voltage is received at a gate thereof; (b) a second MOS transistor, a drain thereof being connected to the gate of the first MOS transistor and a source thereof being grounded, which operatively turns on to ground the gate of the first MOS transistor so as to forcefully turn off the first MOS transistor when a first signal exceeding a threshold voltage thereof is received at a gate thereof; and (c) circuit means including MOS devices for detecting whether a drain potential of the first MOS transistor after the switching signal is applied to the gate of the first MOS transistor changes and outputting the first signal to the gate of the second MOS transistor when the drain potential of the first MOS transistor remains at the DC power supply voltage.

BRIEF DESCRIPTION OF THE DRAWINGS

A more complete understanding of the present invention may be obtained from the following detailed description taken in conjunction with the drawings in which like reference numerals designate corresponding elements and in which:

FIG. 4(a) and 4(b) are signal timing charts of a drain potential of a power MOS transistor and output potential of an integrator shown in FIG. 2 in a case where a load having a large capacity is used and the load is operating normally and in a case where the load is short-circuited for explaining the operation of the switching circuit SW2 shown in FIG. 2;

DETAILED DESCRIPTION OF PREFERRED EMBODIMENTS

Reference will be made hereinafter to the drawings in order to facilitate understanding of the present invention.

Figure 1:
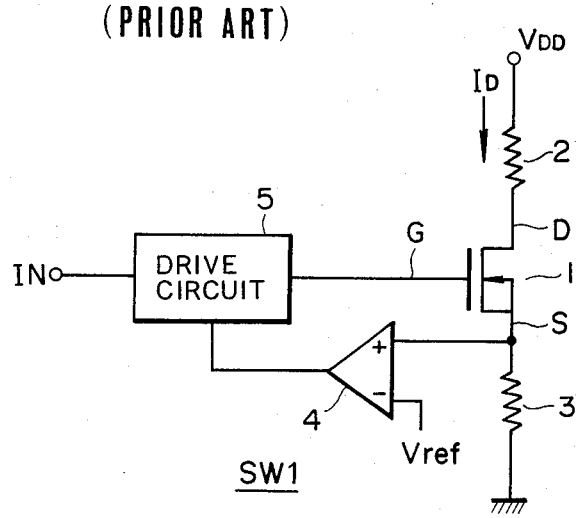
FIG. 1 is an electric circuit wiring diagram of a conventional switching circuit SW1.

FIG. 1 shows a conventional switching circuit SW1, wherein a resistor 3 with a low resistance value is connected in series with the source of a power MOS transistor 1. Resistor 3 detects the change in a drain current flowing through the drain and source of the power MOS transistor 1 by converting the change in the drain current thereof into a corresponding voltage. A comparator 4 compares the converted voltage, i.e., the voltage across the resistor 3 with a reference voltage $V_{ref}$, i.e., corresponding to a maximum allowable drain current. A drive circuit 5 connected between an input terminal IN of the switching circuit SW1 and gate terminal of the power MOS transistor 1 is actuated in response to the comparator output voltage of the comparator 4. When the converted voltage exceeds the reference voltage $V_{ref}$, the potential of the gate G of the MOS transistor 1 with respect to ground is forcefully turned to a low level "L", wereby the power MOS transistor 1 is protected from being destroyed due to a large power dissipation caused by the increase in drain current when a load 2 is short-circuited.

Figure 2:
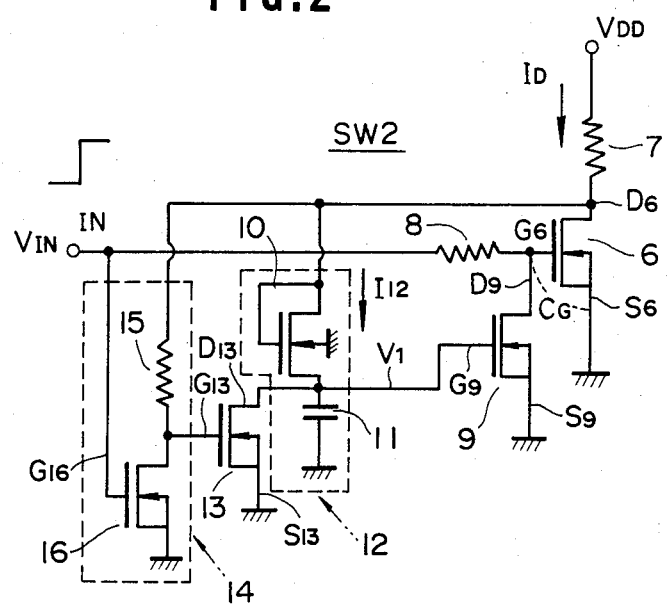
FIG. 2 is an electric circuit wiring diagram of a semiconductor switching circuit SW2 showing a first preferred embodiment according to the present invention.

FIG. 2 shows a first preferred embodiment of a switching circuit SW2 according to the present invention.

In FIG. 2, numeral 6 denotes an N-channel enhancement-mode vertical power MOS transistor, a source $S_6$ thereof being grounded, a drain $D_6$ thereof being connected to a power supply $V_{DD}$ via a load 7, and a gate $G_6$ thereof being connected to a switching signal input terminal IN of the switching circuit SW2.

When a potential $V_{IN}$ of the switching signal input terminal IN is instantaneously turned from the low level "L" to the high level "H" or from the high level "H" to the low level "L", the potential at the gate $G_6$ rises or drops with a time constant determined by the resistance value of a resistor 8 and gate capacitance $C_G$. Thus, the MOS transistor 6 turns on or turns off and the drain current D flows from the power supply $V_{DD}$ through the load 7 to the ground or is interrupted.

Numeral 9 denotes an N-channel enhancement-mode transverse MOS transistor, the source $S_9$ thereof being grounded and drain $D_9$ thereof being connected to the gate $G_9$ of the above-described power MOS transistor 6. Hence, when the gate potential $V_{G9}$ of the MOS transistor 9 arrives at a threshold voltage $V_{T9}$ thereof, the MOS transistor 9 turns on so that the gate potential $V_{G6}$ of the power MOS transistor 6 becomes substantially equal to the ground potential.

On the other hand, an integrator 12 is provided between the drain $D_6$ of the MOS transistor 6 and ground. The integrator 12 comprises a MOS resistor 10 and MOS capacitor 11. Particularly in this example, an N-channel enhancement-mode transverse MOS transistor 10 is used, the drain thereof being short-circuited to the gate thereof so that the MOS transistor 10 operates in a saturation region when the gate potential thereof exceeds its threshold voltage. In addition, since the output terminal of the integrator 12 is connected to the gate $G_9$ of the MOS transistor 9, simultaneously when the output voltage of the integrator 12 increases and exceeds the threshold voltage $V_{T9}$, the MOS transistor 9 turns on.

Numeral 13 denotes another N-channel enhancement-mode transverse type MOS transistor forming a discharge path for capacitor 11 constituting the integrator 12, the source $S_{13}$ thereof being grounded and the drain $D_{13}$ thereof being connected to the output terminal of the integrator 12. When a gate potential $V_{G13}$ increases and exceeds its threshold voltage $V_{T13}$, the MOS transistor 13 turns on so that the capacitor 11 is rapidly discharged and the output voltage of the integrator 12 is rapidly reduced to zero potential.

Numeral 14 denotes an inverter comprising a resistor 15 and N-channel enhancement-mode transverse type MOS transistor 16 connected in series with the resistor 15.

A bias supply of the inverter 14 is the drain potential $V_{D6}$ of the above-described MOS transistor 6 and the gate $G_{16}$ of the MOS transistor 16 is connected to the switching signal input terminal IN.

Therefore, the output potential of the inverter 14 is an inverted form of the switching signal supplied to the input terminal IN. Consequently, the MOS transistor 13 turns on or off according to the output potential of the MOS transistor 16 of the inverter 14.

An operation of the switching circuit SW2 of the construction described above will be described with reference to timing charts of FIGS. 3(a) and 3(b).

Figure 3:
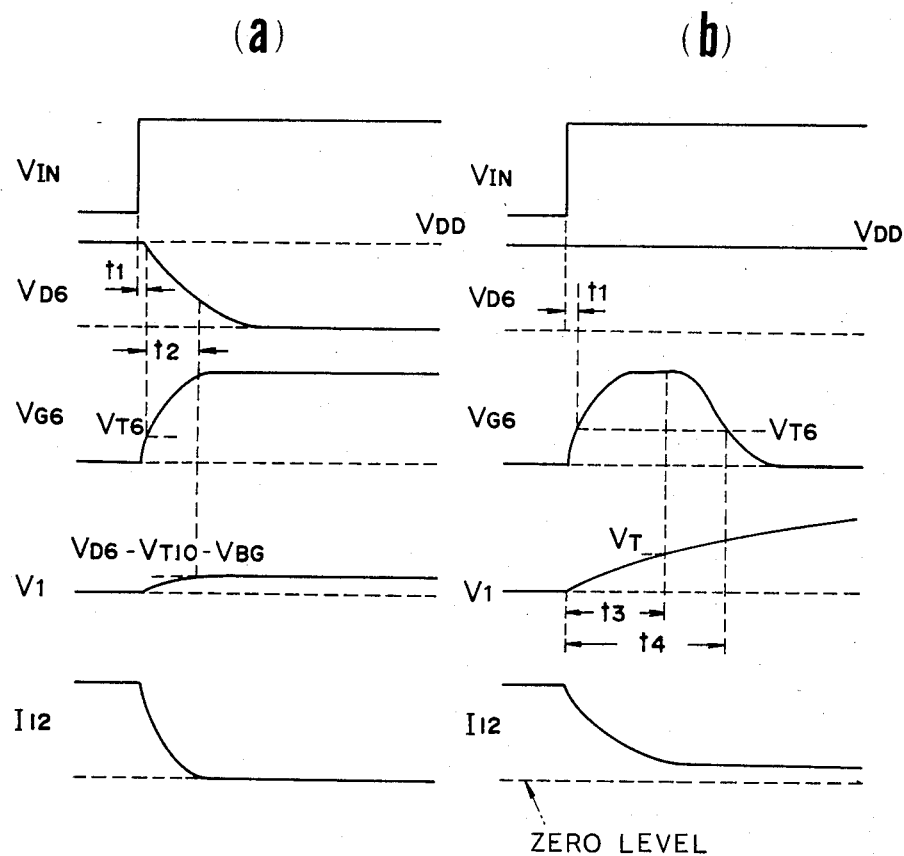
FIGS. 3(a) and 3(b) are signal timing charts of each circuit block shown in FIG. 2 when a load is normally operating and when a load is short-circuited, respectively.

FIG. 3(a) shows an operation timing chart of the switching circuit SW2 in a case when the load 7 shown in FIG. 2 operates normally.

As shown in FIG. 3(a), when the input potential $V_{IN}$ at the input terminal IN of the switching circuit SW2 is changed from the low level "L" to the high level "H" in order to turn on the MOS transistor 6, the gate potential $V_{G6}$ of the MOS transistor 6 starts to rise slowly with a time constant $\tau(=C_G \cdot R)$ determined by a resistance value R of the resistor 8 and a gate capacitance $C_G$ with respect to the source of the MOS transistor 6. When a time $t_1$ has passed upon the rise of the input potential $V_{IN}$, the gate potential $V_{G6}$ of the MOS transistor 6 exceeds the threshold voltage $V_{T6}$ of the MOS transistor 6. At this time, the MOS transistor 6 is transferred to the on state so that the drain current $I_D$ starts to flow through the load 7 and simultaneously the drain potential $V_{D6}$ of the MOS transistor 6 starts to decrease due to a voltage drop across the load 7.

On the other hand, simultaneously when the input potential $V_{IN}$ is changed from the low level "L" to the high level "H", the output potential of the inverter 14 is changed from the high level "H" to the low level "L". Consequently, the MOS transistor 13 is turned to the off state so that the capacitor 11 of the integrator 12 starts charging. The value of the output potential $V_1$ of the integrator 12, at this time, rises more slowly than the gate potential $V_{G6}$ of the MOS transistor 6. Because of this, before the output potential $V_1$ of the integrator 12 arrives at the threshold voltage $V_{T9}$ of the MOS transistor 9, in other words, at a time when a time $t_2$ has passed upon the rise of the input potential $V_{IN}$, the drain potential $V_{D6}$ of the MOS transistor 6 is decreased below the threshold voltage $V_{T9}$. Consequently, the output potential $V_1$ of the integrator 12 can be expressed as:

$$V_1 = V_{D6} - V_{T10} - V_{BG}$$

wherein $V_{D6}$ denotes a value of the drain potential of the MOS transistor 6 when the rise in potential $V_1$ at the output terminal of the integrator 12 is stopped; $V_{T10}$ denotes a threshold voltage of the MOS resistor 19 and $V_{BG}$ denotes a back gate (or substrate) effect of the MOS resistor 10 which changes the threshold voltage according to the difference in potential between the source and substrate thereof. In this way, the output potential $V_1$ of the integrator 12 is clipped at a value given by the above-expressed equation.

If the output potential $V_1$ is set as $V_1 < V_{T9}$, the gate potential $V_{G6}$ of the MOS transistor 6 is held in the high level "H" and the drain current $I_D$ continues to flow through the MOS transistor 6 since the output potential $V_1$ of the integrator 12 does not increase and exceed the threshold voltage $V_{T9}$ of the MOS transistor 9.

Next, when the input potential $V_{IN}$ is instantaneously changed from the high level "H" to the low level "L" in order to turn off the MOS transistor 6, the gate capacitor $C_G$ of the MOS transistor 6 is discharged through the resistor 8 and at a time when $V_{G6} < V_{T6}$ the MOS transistor 6 completely turns off so that the drain current $I_D$ cannot flow any more. The capacitor 11 of the integrator 12 is discharged quickly through the MOS transistor 13 so that the output potential $V_1$ of the integrator 12 is linearly reduced to substantially zero potential.

In this way, the MOS transistor 6 normally performs the switching action according to the level changes between the high level "H" and low level "L" of the potential $V_{IN}$ of the switching signal.

FIG. 3(b) shows an operation timing chart of the switching circuit SW2 in a case when the load 7 shown in FIG. 2 is short-circuited.

In FIG. 3(b), when the input potential $V_{IN}$ at the input terminal IN of the switching circuit SW2 is changed from the low level "L" to the high level "H" in order to turn on the MOS transistor 6, the gate potential $V_{G6}$ of the MOS transistor 6 starts to rise with the time constant determined by the resistance value R of the resistor 8 and gate capacitance $C_G$ in the same way as in the case of the normally operating load 7. When the time $t_1$ has passed and the gate potential $V_{G6}$ of the MOS transistor 6 becomes equal to the threshold voltage $V_{T6}$ thereof, the MOS transistor 6 turns on to cause the drain current $I_D$ to flow between the drain $D_6$ and source $S_6$ thereof. It should be noted that since the load 7 is short-circuited in this case, the drain $D_6$ of the MOS transistor 6 receives directly the power supply voltage $V_{DD}$ so that the drain potential $V_{D6}$ becomes the power supply voltage $V_{DD}$.

On the other hand, the output potential $V_1$ of the integrator 12 starts to rise gradually in response to the rise of the input potential $V_{IN}$. However, since the drain potential $V_{D6}$ is held at the power supply potential $V_{DD}$ when the MOS transistor 6 turns on, the rise of the output potential $V_1$ of the integrator 12 continues beyond where it would have in the case of normally operating load 7 described above. Therefore, when a time $t_3$ has passed, the output potential $V_1$ of the integrator 12 arrives at the threshold voltage $V_{T9}$ of the MOS transistor 9.

At this time, the MOS transistor 9 turns on, the gate potential $V_{G6}$ starts to decrease and accordingly the drain current $I_D$ starts to decrease gradually. Finally, when a time $t_4$ has passed and the gate potential $V_{G6}$ of the MOS transistor 6 decreases below the threshold voltage $V_{T9}$ thereof, the drain current $I_D$ will not flow through the MOS transistor 6.

As described above, since the drain current $I_D$ of the MOS transistor 9 flows for a very short period of time from the time when the potential $V_{IN}$ of the switching signal is changed from the low level "L" to the high level "H" to the time of $t_4$, i.e., $t_4 - t_1$, the MOS transistor 6, i.e., switching element cannot be thermally destroyed caused by the power dissipation found in the conventional switching circuit SW1.

It should be noted that the values of the above-described time intervals $t_1$, $t_2$, and $t_4$ can be properly set by the modification of gate width and gate length of the MOS resistor 10, capacitance value of the MOS capacitor 11, and resistance value of the resistor 8.

Next in the case when the potential $V_{IN}$ of the switching signal is changed from the high level "H" to the low level "L", the capacitor 11 of the integrator 12 is discharged rapidly through the MOS transistor 13 which is turned on by the inverter 14 so that the integrator 12 is reset.

Assuming that the normally operating load 7 is suddenly short-circuited with the MOS transistor 6 turning on, the output potential $V_1$ of the integrator 12 immediately starts to rise above the level expressed as $V_1 = V_{D6} - V_{T10} - V_{BG}$ in FIG. 3(a). After a minute time has passed, the output potential $V_1$ of the integrator 12 exceeds the threshold voltage $V_{T9}$ of the MOS transistor 9 so that the MOS transistor 9 turns on. Thereafter, the gate potential $V_{G6}$ of the MOS transistor 6 is reduced below the threshold voltage as shown in FIG. 3(b) so that the drain current $I_D$ thereof is interrupted.

In this way, since the short-circuiting of the load 7 is detected on a basis of the value of the drain potential $V_{D6}$ of the MOS transistor 6 in this embodiment, wasteful power consumption in the resistor 3 having a low resistance value during the turning on of the MOS transistor 7 will not result as in the conventional switching circuit SW1 wherein the resistor 3 is connected to the source of the MOS transistor 1 to detect the short-circuiting of the load 7 on a basis of the change in the load current passing through the resistor 3.

Furthermore, in this embodiment since the MOS transistor 13 for discharging the MOS capacitor 11 is connected between the end of the MOS capacitor 11 and ground as shown in FIG. 2 in parallel with the MOS capacitor 11 and the inverter 14 provides on and off control for the MOS transistor 13 according to the inverted switching signal of the input potential $V_{IN}$, the output potential $V_1$ of the integrator 12 is immediately turned to the low level "L" when the input potential $V_{IN}$ is changed from the high level "H" to the low level "L". In addition, there are less dispersions in the charge time of the integrator 12 in the case when the input potential $V_{IN}$ is changed to the high level "H" repeatedly in a very short period of time. Furthermore, in this embodiment, since the MOS transistor 10 in which the drain is directly connected to the gate thereof is used, the output potential $V_1$ of the integrator 12 increases temporarily as a function of time until the drain potential of the MOS resistor 10, i.e., the drain potential of the MOS transistor 6 is settled, whereas if a linear resistor is used in place of the MOS transistor 6, the value of the linear resistor is so high that high circuit density is impossible.

Furthermore, since in this embodiment N-channel source-grounded power MOS transistor 6 is used as the power switching element, N channel source-grounded MOS transistor 9 is used as the element for the gate grounding of the MOS transistor 6, the MOS capacitor 11 and MOS resistor 10 are used as circuit elements for the integrator 12, N channel source-grounded MOS transistors are used as the capacitor discharging element 13 and inverter circuit element 16, respectively, a power MOS transistor of a vertical type having an extremely small on resistance which is used as the power MOS transistor 6 can easily be integrated on a same semiconductive substrate as those transverse MOS transistors used as their respective circuit elements.

In addition, since both the input resistor 8 connected to the gate $G_6$ of the MOS transistor 6 and load resistor 15 of the inverter 14 have relatively high resistance values, an area within which these resistors are occupied is so small that high circuit density integrated circuit (IC) can be realized.

Still furthermore, since both the bias supply of the integrator 12 which actuates the MOS transistor 9 and gate potential of the MOS resistor 10 use the drain potential $V_{D6}$ of the power MOS transistor 6, the output ratio of the integrator 12 between the case of the normally operating load and that of the short-circuited load can be set larger in a case when a large capacity lamp which has a tendency of reducing slowly the drain potential $V_{D6}$ of the MOS transistor 6 is used as a load, thus a time required for determining that the load is short-circuited being reduced.

The above-described effect will be described hereinbelow with reference to timing charts of FIGS. 4(a) and 4(b), comparing the case of detecting the short-circuiting of the load wherein the drain potential $V_{D6}$ remains the high level "H" after a fixed time interval has elasped upon the rise of the input potential $V_{IN}$ from the low level "L" to the high level "H".

FIG. 4(a) shows the changes of waveforms in the drain potential $V_{D6}$ and output potential $V_1$ of the integrator 12 in a case when the load 7 is normally operating.

FIG. 4(b) shows the changes of waveforms in the drain potential $V_{D6}$ and output potential $V_1$ of the integrator 12 in a case when the load 7 is short-circuited.

As shown in FIG. 4(a), supposing that the power supply voltage $V_{DD}$ is 12 volts, the high level "H" of the input potential $V_{IN}$ is 5 volts, and the large capacity lamp is used as the load 7, at least time $T_1$ is required for the drain potential $V_{D6}$ of the MOS transistor 6 to reduce until a threshold voltage $V_T$ (approximately 1 through 2 volts) is reached in a case when the lamp is operating normally.

Hence, if the short-circuiting of the load 7 is detected by the utilization of the threshold voltage $V_T$ of the MOS transistor on a basis of whether the drain potential $V_{D6}$ is reduced below the threshold voltage $V_T$, at least time $T_1$ is required when the input potential $V_{IN}$ is changed from low level "L" to the high level "H".

In this case, since the drain current $I_D$ continues to flow in the MOS transistor 6 during the time period of $T_1$, the MOS transistor 6 will be damaged due to an excessive length of time $T_1$ (considerably longer than 10 milliseconds) as the capacity of the lamp used as the load 7 becomes larger.

However, since the drain potential $V_{D6}$ is used as the input bias supply of the integrator 12, a remarkable difference exists between an ascending slope of the waveform in the output potential $V_1$ when the load 7 is operating normally and that of the waveform in the output potential $V_1$ when the load 7 is short-circuited. In more detail, the output potential $V_1$ of the integrator 12 does not exceed the threshold voltage $V_{T9}$ of the MOS transistor 9 when the load 7 is operating normally, whereas the output potential $V_1$ of the integrator 12 exceeds the threshold voltage $V_{T9}$ in an extremely short time $T_2$ after the input potential $V_{IN}$ is turned the high level "H". Therefore, the determination of the normal operation or short-circuit in the load 7 can be effected with the time $T_2$ which is shorter than the above-described time $T_1$. Consequently, the damage of the MOS transistor 6 can be avoided.

Next, structures of each part of the above-described switching circuit SW2 which is integrated in a single chip will be described hereinbelow with reference to FIG. 5 through FIG. 7.

Figure 5:
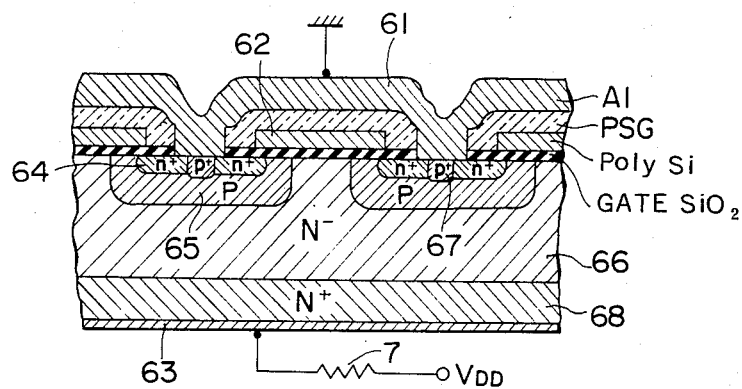
FIG. 5 is a sectional view showing a structure of an N-channel vertical power MOS transistor used as the switching element.

FIG. 5 shows a structure of the MOS transistor 6 in the switching circuit SW1.

Figure 6:
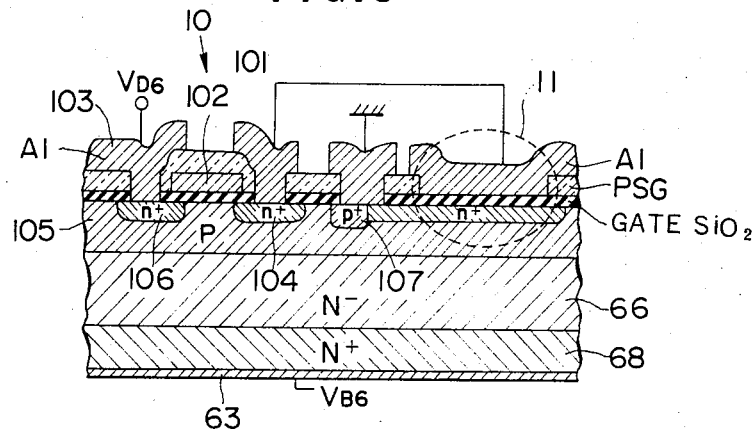
FIG. 6 is a sectional view showing an integral structure of a MOS resistor and MOS capacitor.

FIG. 6 shows a structure of the MOS resistor 10 and MOS capacitor 11.

Figure 7:
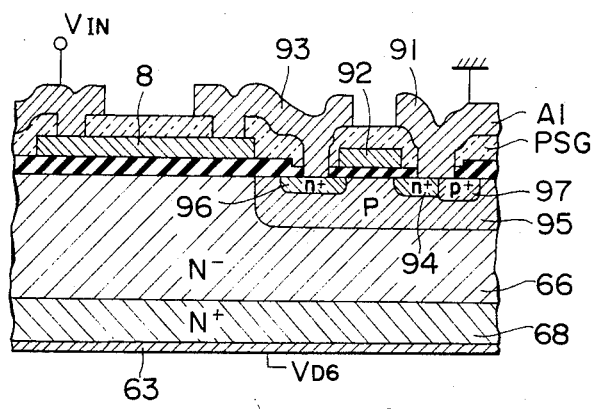
FIG. 7 is a sectional view showing an integral structure of a poly-silicon resistor and transverse MOS transistor.

FIG. 7 shows a structure of the fixed resistor 8 and MOS transistor 9 shown in FIG. 2.

FIG. 5 illustrates a well known structure of a vertical MOS Field Effect Transistor device. In FIG. 5, numeral 61 denotes a source electrode preferably of deposited aluminium (Al), numeral 62 denotes a gate electrode, numeral 63 denotes a drain electrode provided to the backside of a substrate 68, numeral 64 denotes a source region, numeral 65 denotes a pair of locally separated channel formed body regions, numeral 66 denotes a drain region which is a part of a common drain region, numeral 67 denotes a high density p+ region, and numeral 68 denotes the substrate (back gate) which serves as a common drain region.

The drain current flows from the n− type drain region 66 through a channel of the p− channel formed body region 65 formed below the gate electrode 62 to the n+ type source region 64. Since the current can flow toward substantially vertical direction with respect to the surface of the MOS device, the on resistance can be reduced, thus suited to the power switching. As shown in FIG. 5, the gate electrode 62 is preferably of doped polysilicon and is spaced from the semiconductor substrate surface by a thin insulating layer preferably of silicon dioxide ($SiO_2$) film. The gate electrode 62 is also isolated from the source electrode 61 of the deposited aluminium by another thin insulating layer preferably of phosphosilicate glass (PSG) film.

FIG. 6 shows a structure of MOS resistor 10 formed by a transverse MOS transistor and MOS capacitor 11, wherein a channel formed body region 105 is formed within the drain region 66 of the vertical MOS transistor 6 shown in FIG. 5 and the MOS resistor 10 and MOS capacitor 11 are located on the channel formed body region 105. In FIG. 6, numeral 101 denotes a source electrode, numeral 102 denotes a gate electrode, numeral 103 denotes a drain electrode, numeral 104 denotes an n+ type drain region, numeral 106 denotes an n+ type source region, numeral 107 denotes a high density P+ type region. As shown in FIG. 6, the MOS capacitor 11 is formed with an n+ type impurity high density region functioned as a lower electrode which is grounded and the deposited aluminium (Al) functioned as an upper electrode, the gate silicon dioxide film ($SiO_2$) being sandwiched by the upper and lower electrodes. Since the MOS transistor 10 and MOS capacitor 11 are formed within the channel formed body region 105, the operating characteristics of the MOS resistor 10 and MOS capacitor 11 are not affected when the MOS transistor 6 is turned on so that the potential of the drain region 66 is varied.

FIG. 7 shows a structure of the transverse MOS transistor 9 shown in FIG. 2.

As shown in FIG. 7, a p type channel formed body region 95 is formed within the drain region 66 of the vertical power MOS transistor 6 in the same way as shown in FIG. 6. In addition, the input resistor 8 is formed by polysilicon (poly-Si) as shown in FIG. 7.

In FIG. 7, numeral 91 denotes a source electrode, numeral 92 denotes a gate electrode, numeral 93 denotes a drain electrode, numeral 94 denotes a source region, numeral 95 denotes the channel formed body region, numeral 96 denotes a drain region, and numeral 97 denotes a high density P+ type region.

Since both the source region 94 and channel formed body region 95 are grounded via the source electrode 91, the potential of the channel formed body region 95 will not be affected by the change in the potential of the drain region 66 due to the switching action of the vertical power MOS transistor 6. Therefore, the transverse MOS transistor 9 operates normally. In addition, since the input resistor 8 is formed of polysilicon on a field silicon dioxide film ($SiO_2$), and is isolated completely from the drain region 66 by the field silicon dioxide film, the input resistor 8 is not affected by the change in the potential of the drain region 66.

In this way, the entire switching circuit SW2 shown in FIG. 2 can be integrated in the single chip wherein the vertical MOS transistor 6 is mounted as appreciated from FIGS. 5 through 7.

Although each circuit element of the switching circuit SW2 is formed in the same chip in this embodiment, each circuit element may be constructed by the individual discrete component since the same desired circuit effect can be obtained.

Figure 8:
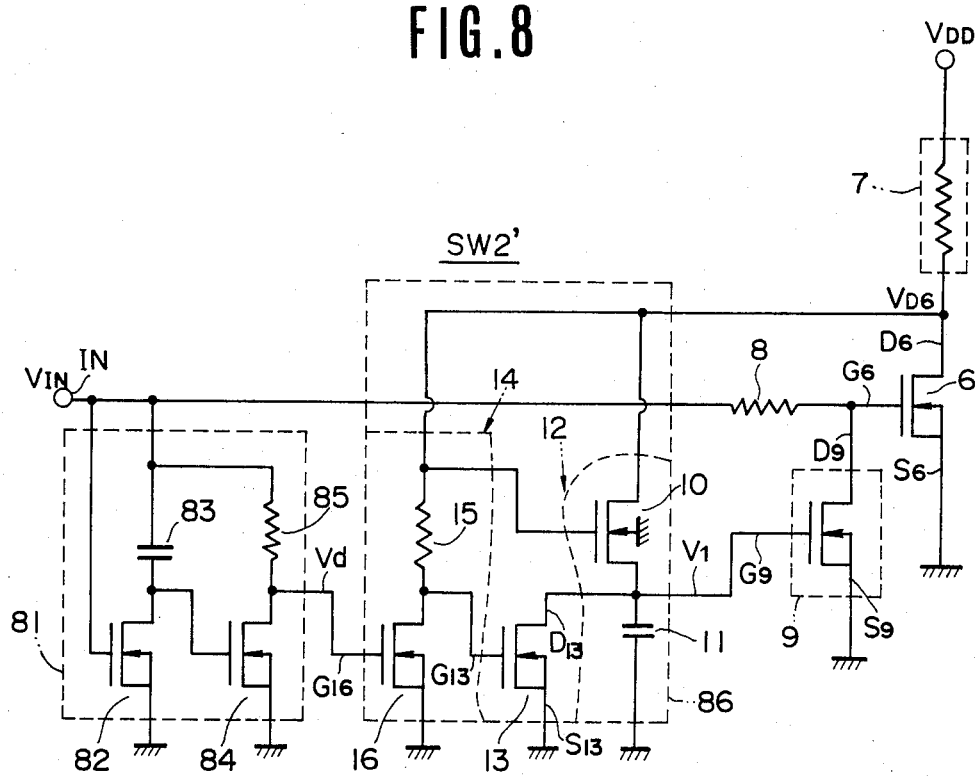
FIG. 8 is an electric circuit wiring diagram of a semiconductor switching circuit SW2' showing a second preferred embodiment according to the present invention.

FIG. 8 shows a second preferred embodiment of the switching circuit SW2' according to the present invention.

In this embodiment, a delay circuit 81 is additionally intervened between the input terminal IN of the input portion of the switching circuit SW2' and input terminal of the inverter 14, i.e., gate $G_{16}$ of the MOS transistor 16 constituting the inverter 14 for delaying the switching signal received at the input terminal IN of the switching circuit SW2' for a fixed time interval Td.

The delay circuit 81 comprises a source-grounded N channel transverse MOS transistor 82, the gate thereof connected to the input terminal IN to function as a MOS resistor and drain thereof connected to one end of a capacitor 83 the other end thereof connected to the input terminal IN, the MOS transistor 82 and capacitor 83 constituting a differentiator, and an inverter including a source-grounded N channel transverse MOS transistor 84, the gate thereof connected to the drain of the MOS transistor 82, i.e., the output terminal of the differentiator and drain thereof being connected to one end of the resistor 84, the other end thereof connected to the input terminal IN. The inverter outputs the inverted output of the differentiator. The remaining circuit configuration is the same as the first preferred embodiment shown in FIG. 2. Therefore, the circuit construction except the delay circuit 81 is not described here.

Figure 9:
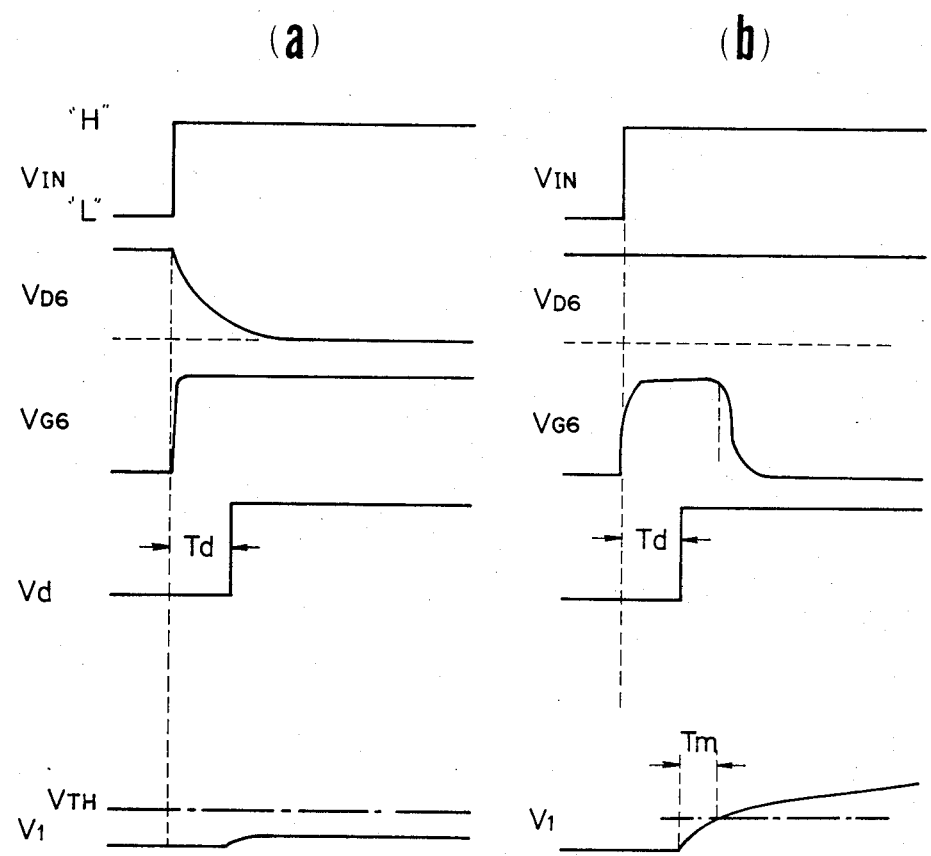
FIGS. 9(a) and 9(b) are signal timing charts of each circuit block shown in FIG. 8 when the load is operating normally and when the load is short-circuited.

FIGS. 9(a) and 9(b) show signal timing charts in the individual circuit blocks shown in FIG. 8.

FIG. 9(a) shows the signal timing chart in a case when the load 7 is operating normally. When the switching signal, i.e., input potential $V_{IN}$ is changed from the low level "L" to the high level "H", the gate potential $V_{G6}$ of the MOS transistor 6 rises relatively rapidly with the slop determined by the gate capacitance $C_G$ and resistance value of the input resistor 8. Simultaneously when the value of the gate potential $V_{G6}$ exceeds the threshold voltage $V_T$ of the MOS transistor 6, the MOS transistor 6 turns on so that the value of the drain potential $V_{DS}$ falls slowly with a slope determined by the transient characteristic of the load 7.

On the other hand, when the fixed time interval Td has passed after the change in the value of the switching signal $V_{IN}$ from the low level "L" to the high level "H", the output potential Vd of the delay circuit 4 is changed from the low level "L" to the high level "H" and accordingly the integrator 12 starts integration of the drain potential $V_{D6}$ with respect to time. At this time, since the drain potential $V_{D6}$ is already reduced in the case of normally operating load 7, the output potential $V_1$ of the integrator 12 cannot exceed the threshold voltage $V_{TH}$ of the MOS transistor 9 so that the MOS transistor 9 remains in the unconductive state and the MOS transistor 6 still turns on.

FIG. 9(b) shows the signal timing chart of the individual circuit blocks in a case when the load 7 is accidentally short-circuited.

As shown in FIG. 9(b), since the drain potential $V_{D6}$ of the MOS transistor 6 is maintained at the power supply voltage $V_{DD}$ even when the delay time Td has elasped after the switching signal $V_{IN}$ is changed from the low level "L" to the high level "H", the integrator 12 starts integration of the drain potential $V_{D6}$ at a time when the delay time interval Td has elasped. Thereafter, at a time when a time Tm has passed the output potential $V_1$ exceeds the threshold voltage $V_{TH}$ of the MOS transistor 9, thus the gate potential $V_{G6}$ of the MOS transistor 6 being grounded so as to turn off the MOS transistor 6. Consequently, the MOS transistor 6 cannot be destroyed due to excessive power dissipation between the drain $D_6$ and source $S_6$ thereof.

Figure 10:
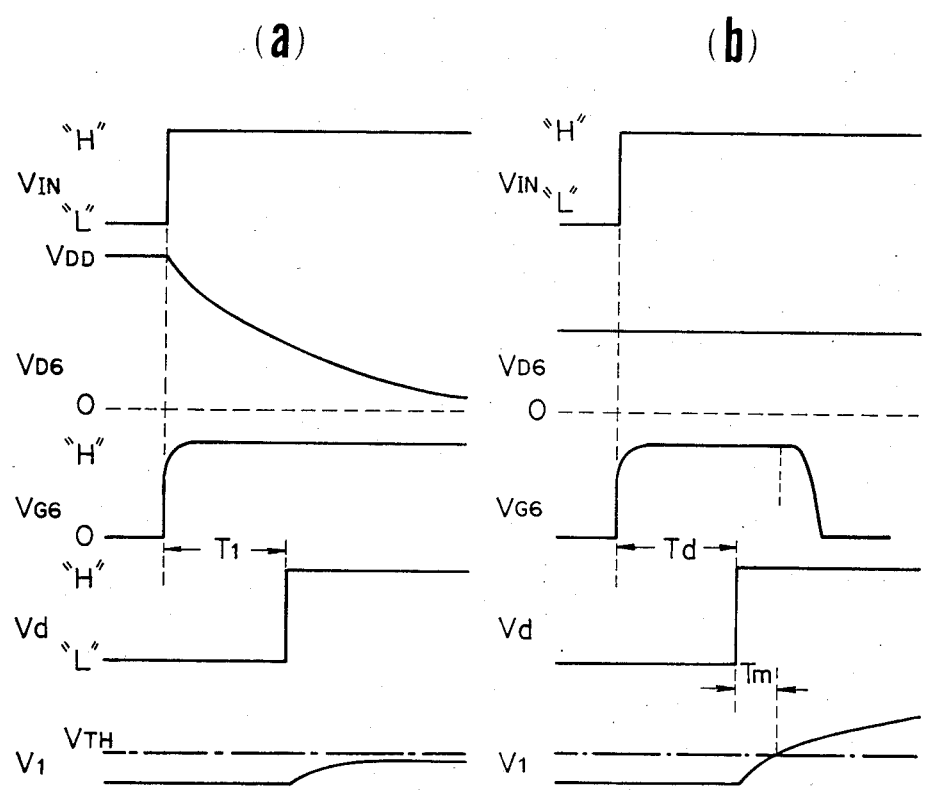
FIGS. 10(a) and 10(b) are signal timing charts of each circuit block shown in FIG. 8, particularly FIG. 10(a) explaining the circuit operation when the load is operating normally and a large capacity lamp is used as the load with the power supply voltage varied to a high level and FIG. 10(b) explaining the circuit operation when the load is short-circuited with the power supply voltage varied to a low level.

FIGS. 10(a) and 10(b) show the signal timing charts of the individual circuit blocks to demonstrate the operation of the switching circuit SW2' shown in FIG. 8 in a case when the bias supply $V_{DD}$ is varied over a wide range or the large capacity lamp is used for the load 7.

In a case when the value of the power supply voltage $V_{DD}$ is extremely high and a large capacity load is used for the load 7 having a resistance indicating a low value at a time when the voltage is applied thereacross but indicating a high value gradually with time as the voltage continues to be applied, the value of the drain potential $V_{D6}$ of the MOS transistor 6 is reduced toward substantially zero volt very slowly in response to the change in level of the switching input signal $V_{IN}$ from the low level "L" to the high level "H".

It should be noted that the value of the fixed delay time interval Td of the delay circuit 81 is present considering a maximum allowable time in which the MOS transistor 6 can withstand the flow of a short-circuited current from the drain thereof $D_6$ to the source thereof $S_6$ when the large capacity lamp used for the load 7 is short-circuited with the bias power supply voltage $V_{DD}$ varied in a high voltage and considering the start timing of the integration of the drain potential $V_{D6}$ by means of the integrator 12 being at a time when the value of the drain potential $V_{D6}$ is sufficiently reduced in a case when the drain potential $V_{D6}$ is reduced very slowly as described above.

Therefore, in the case when the drain potential $V_{D6}$ is reduced very slowly, the drain potential $V_{D6}$ already indicates a low value at a time when the output potential Vd of the delay circuit 81 is changed from the low level "L" to the high level "H". It will be thus appreciated that the output potential $V_1$ of the integrator 12 cannot exceed the threshold voltage $V_{T9}$ of the MOS transistor 9 when the integration starts at this time. Consequently, the MOS transistor 9 will not turn on even if the bias power supply voltage is varied to the extremely high voltage level.

On the contrary, in a case when the load 7 is short-circuited with power supply voltage $V_{DD}$ varied to a very low voltage level, the drain potential $V_{D6}$ remains at the power supply voltage $V_{DD}$ when the fixed time interval Td of the delay circuit 81 has passed as shown in FIG. 10(b). The integration of the integrator 12 starts from the time Td. When the time interval Tm has passed, the output potential $V_1$ of the integrator 12 exceeds the threshold voltage $V_{T9}$ of the MOS transistor 9 so that the MOS transistor 9 turns on and accordingly the MOS transistor 6 turns off.

It will be appreciated that the total value of the two time intervals Td+Tm is predetermined, the maximum allowable time as a factor in which the MOS transistor 6 can withstand the maximum power dissipation caused by the flow of a short-circuit current and applied voltage.

In this embodiment, the switching circuit SW2' shown in FIG. 8 can achieve the protection of the MOS transistor 6 when the load 7 is short-circuited on a basis of the tendency of change in the potential at the drain of the MOS transistor 6 after the switching input signal $V_{IN}$ is changed from the low level "L" to the high level "H", irrespective of the kind of load 7 or wide variation of the power supply voltage $V_{DD}$. In addition, the delay circuit 81, integrator 12, inverter 14, MOS transistor 9, and input resistor 8 can be integrated on the same semiconductive substrate as the power MOS transistor 6.

On the other hand, since the delay circuit 81 is so constructed that the differentiator forms a pulse having a predetermined duration in response to the rise of the switching input signal $V_{IN}$ and the rise of the pulse is compared with the threshold voltage of the MOS transistor 84, a capacitance of the capacitor 83 can have an extremely low value and thus can occupy reduced area of the chip. Therefore, the delay circuit 81 of the construction described above is suitable for high density integration.

Figure 11:
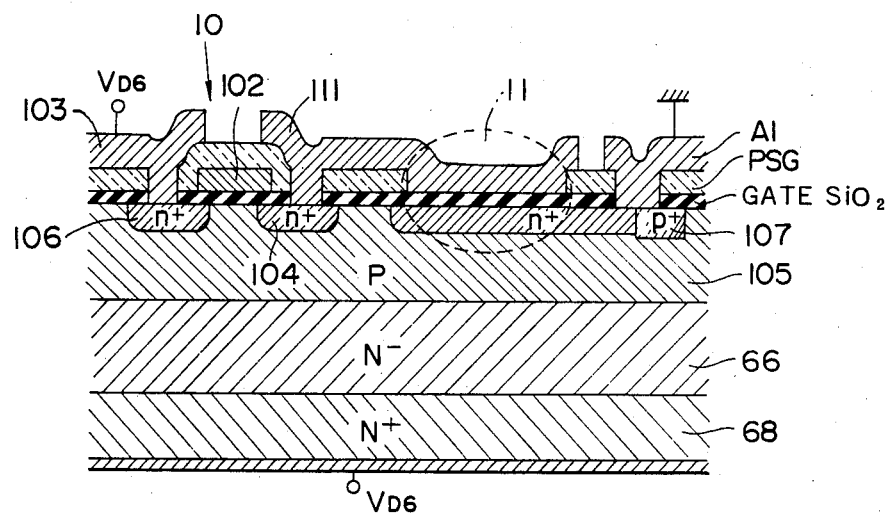
FIG. 11 is a sectional view showing another example of a structure of N channel transverse MOS transistor and capacitor connected in series therewith.

FIG. 11 shows an example of each structure of parts in the switching circuit SW2' integrated on a single semiconductive substrate.

The structure of N channel vertical MOS transistor 6 shown in FIG. 8 is already shown in FIG. 5.

FIG. 11 shows a structure of an N channel transverse MOS transistor and MOS capacitor connected in series with the N channel transverse MOS transistor. The structure shown in FIG. 11 is almost the same as shown in FIG. 6. In FIG. 11, numeral 111 denotes a source electrode made of aluminium (Al). It should be noted that in FIG. 11 the source electrode 111 of the N channel transverse MOS transistor serves as one end of the MOS capacitor 11 indicated by a broken line which is structural difference shown in FIG. 6. The other structures are the same as shown in FIG. 6 as appreciated from FIG. 11 and FIG. 6.

The other combination of MOS capacitor and N channel transverse MOS transistor, i.e., capacitor 83 and MOS transistor 82 can be structured as shown in FIG. 6 or FIG. 11.

In addition, the combination of the MOS resistor and N channel transverse MOS transistor, e.g., input resistor 8 and MOS transistor 9, resistor 15 and MOS transistor 16, resistor 85 and MOS transistor 84 can be structured as shown in FIG. 7.

In this way, the vertical power MOS transistor, transverse MOS transistor, capacitor, and resistor are structed as shown in FIGS. 5, 6, 7, and 11, these circuit elements can be integrated on the same substrate as the power MOS transistor.

Although in these first and second embodiments, N-channel vertical MOS transistors are used in the power MOS transistor 6 and other semiconductive devices, P channel vertical MOS transistor may alternatively be used as the power MOS transistor and P channel type transverse MOS transistors may correspondingly be used as the remaining MOS transistors.

As described hereinbefore, the switching circuit according to the present invention can assure the protection of the power MOS transistor from being thermally destroyed due to excessive power dissipation when a load is short-circuited. This can be achieved irrespective of the variation in the power supply voltage and characteristic of a load connected to the drain of the power MOS semiconductive device.

In this disclosure, there is shown and described only the preferred embodiments of the invention, but as aforementioned, it is to be understood that the invention is capable of other and different embodiments, and its several details are capable of various obvious modifications, all without departing from the inventive spirit thereof.

What is claimed is:

1. A semiconductor switching circuit for switching on and off a current flow through a load according to a switching signal inputted thereto, comprising:
   (a) a first MOS transistor having a drain, a source and a gate, said drain thereof being connected to a DC power supply through the load and said source thereof being grounded, said first MOS transistor turning on when the switching signal is received at said gate thereof;
   (b) a first resistor connected between an input terminal at which the switching signal for turning on said first MOS transistor is inputted and gate of said first MOS transistor;
   (c) a second MOS transistor, a drain thereof connected to the gate of said first MOS transistor and a source thereof being grounded, said second MOS transistor operatively turning on to ground the gate of said first MOS transistor so as to forcefully turn off said first MOS transistor when a first signal exceeding a threshold voltage is received at a gate thereof; and
   (d) circuit means for detecting a change in a drain potential of said first MOS transistor after the switching signal is applied to the gate of said first MOS transistor and outputting the first signal to the gate of said second MOS transistor when the drain potential of said first MOS transistor remains at a high level, said circuit means being responsive to said drain potential for outputting as said first signal a voltage having a level which increases to a level near said drain potential high level when said drain potential remains at said high level.

2. The semiconductor circuit as set forth in claim 1, further comprising means for delaying the detection of a change in the drain potential of said first MOS transistor for a predetermined interval of time after the switching signal is applied to the gate of said first MOS transistor.

3. The semiconductor switching circuit as set forth in claim 2, wherein said predetermined period of time of said delay means together with a response time interval of said circuit means from the time when said circuit means detects the change in the drain potential of said first MOS transistor to the time when said circuit means outputs the first signal are less than a maximum allowable time during which drain current can flow through said first MOS transistor with the power supply voltage applied across the drain and source thereof.

4. A semiconductor switching circuit for switching on and off a current flow through a load according to a switching signal inputted thereto, comprising:
   (a) a first MOS transistor, a drain thereof being connected to a DC power supply through the load and source thereof being grounded which turns on when the switching signal exceeding a threshold voltage thereof is received at the gate thereof;
   (b) a first resistor intervened between an input terminal at which the switching signal for turning on said first MOS transistor is inputted and gate of said first MOS transistor;
   (c) an integrator which operatively integrates the drain potential of said first MOS transistor;
   (d) a second MOS transistor, a drain thereof being connected to the gate of said first MOS transistor, source thereof being grounded and gate thereof being connected to an output terminal of said integrator, which operatively turns on to ground the gate of said first MOS transistor so as to turn off said first MOS transistor when the output potential of said integrator exceeds a threshold voltage thereof;
   (e) an inverter which inverts the potential of the input terminal thereof through which the switching signal is inputted; and
   (f) a third MOS transistor, a drain thereof being connected to the output terminal of said integrator, a source thereof being grounded, and gate thereof being connected to an output terminal of said inverter, which sets and resets said integrator according to the inverted output potential of said inverter, whereby said first MOS transistor is forcefully turned off when the load is short-circuited.

5. The semiconductor switching circuit as set forth in claim 4, further comprising a delay circuit which sends the switching signal at the input terminal to said inverter after a predetermined delay of time.

6. The semiconductor switching circuit as set forth in claim 5, wherein said integrator comprises a fourth MOS transistor, a drain and gate thereof being connected to the drain of said first MOS transistor and a first capacitor, one end thereof being grounded and the other end thereof being connected to the source of said fourth MOS transistor and wherein said inverter comprises a second resistor, one end thereof being connected to the drain of said first MOS transistor and the other end thereof being connected to the gate of said third MOS transistor, and a fifth MOS transistor, a drain thereof being connected to the gate of said third MOS transistor together with said second resistor, a source thereof being grounded, and a gate thereof being connected to the input terminal.

7. The semiconductor switching circuit as set forth in claim 6, wherein said first and second resistors and first capacitor are manufactured in the same semiconductive chip with said first through fifth MOS transistors.

8. The semiconductor switching circuit as set forth in claim 6, wherein said first MOS transistor is enhancement-mode vertical type MOS transistor and said second through fifth MOS transistor are enhancement-mode transverse type MOS transistors.

9. The semiconductor switching circuit as set forth in claim 5, wherein said delay circuit comprises a differentiator and another inverter, said differentiator including a sixth MOS transistor, a gate thereof being connected to the input terminal and a source thereof being grounded, and a second capacitor one end thereof being connected to the input terminal and the other end thereof being connected to a drain of said sixth MOS transistor, and said inverter including a seventh MOS transistor, a gate thereof being connected to the drain of said sixth MOS transistor, a source thereof being grounded, and a third resistor, one end thereof being connected to the input terminal and the other end thereof being connected to a drain of said seventh MOS transistor and connected to said inverter.

10. The semiconductor switching circuit as set forth in claim 9, wherein said integrator comprises a fourth MOS transistor, a drain and gate thereof being connected to the drain of said first MOS transistor and a first capacitor, one end thereof being grounded and the other end thereof being connected to the source of said fourth MOS transistor, wherein said inverter comprises a second resistor, one end thereof being connected to the drain of said first MOS transistor and the other end thereof being connected to the gate of said third MOS transistor, and a fifth MOS transistor, a drain thereof being connected to the gate of said third MOS transistor together with said second resistor, a source thereof being grounded, and a gate thereof being connected to the drain of said seventh MOS transistor, and wherein said first through third resistors and first and second capacitors are manufactured in the same semiconductive chip with said first through seventh MOS transistors.

11. The semiconductor switching circuit as set forth in claim 5, wherein the sum of predetermined delay time by means of said delay circuit and the interval of time during which said integrator starts integration of the drain potential of said first MOS transistor in response to the turning off of said third MOS transistor and the output potential of said integrator exceeds the threshold voltage of said second MOS transistor is determined in consideration of a maximum allowable time during which said first MOS transistor can withstand the flow of drain current when the load is short-circuited and the power supply voltage is directly applied across the drain and source of said first MOS transistor.

* * * * *